(12) United States Patent
Marsh et al.

(10) Patent No.: US 6,671,300 B2
(45) Date of Patent: Dec. 30, 2003

(54) OPTICAL DEVICES

(75) Inventors: John Haig Marsh, Glasgow (GB); Craig James Hamilton, Bishopton (GB)

(73) Assignee: The University Court of the University of Glasgow (GB)

(*) Notice: Subject to any disclaimer, the term of this patent is extended or adjusted under 35 U.S.C. 154(b) by 76 days.

(21) Appl. No.: 09/789,046

(22) Filed: Feb. 20, 2001

(65) Prior Publication Data

US 2002/0097763 A1 Jul. 25, 2002

(30) Foreign Application Priority Data

Jan. 23, 2001 (GB) ............................................ 0101640

(51) Int. Cl.[7] .................................................. H01S 5/00
(52) U.S. Cl. ............................. 372/45; 372/43; 372/44
(58) Field of Search ................................ 372/43, 44, 45

(56) References Cited

U.S. PATENT DOCUMENTS

| 4,282,494 A | 8/1981 | Yonezu et al. |
|---|---|---|
| 4,511,408 A | 4/1985 | Holonyak, Jr. |
| 4,585,491 A | 4/1986 | Burnham et al. |
| 4,594,603 A | 6/1986 | Holonyak, Jr. |
| 4,639,275 A | 1/1987 | Holonyak, Jr. |
| 4,727,556 A | 2/1988 | Burnham et al. |
| 4,845,216 A | 7/1989 | Taylor et al. |
| 4,845,727 A | 7/1989 | Murray |
| 4,857,971 A | 8/1989 | Burnham |
| 4,871,690 A | 10/1989 | Holonyak, Jr. et al. |
| 5,327,444 A | * 7/1994 | Mooradian .................... 372/44 |
| 5,384,797 A | 1/1995 | Welch et al. |
| 6,326,646 B1 | * 12/2001 | Baillargeon et al. .......... 372/44 |

OTHER PUBLICATIONS

McIlvaney et al., "Far–field behaviour of 980 nm broad area lasers incorporating bandgap widened extended slab waveguides", Oct. 26, 1994, IEEE (1995).
Qian et al., "Three Band–gap QW Intermixing in InP/InGaAs/InGaAsP System for Monolithically Integrated Optical Switch", IEEE 1998, pp. 194–195.

(List continued on next page.)

*Primary Examiner*—Paul Ip
*Assistant Examiner*—Cornelius H Jackson
(74) *Attorney, Agent, or Firm*—Piper Rudnick; Jefferson Perkins

(57) ABSTRACT

There is disclosed an improved optical device (10;10a), eg comprising a semiconductor optically active or optoelectronic devices such as lasers, modulators, amplifiers, switching structures, or the like, mounted on a heatsink (28;28a) The invention provides an optically active device (10;10a) comprising a device body (12;12a) having an active region (14;14a) and an optically passive region(s) (20;22) provided at one or more ends (24,26;26a) of the active region (14;14a); and a heatsink (28;28a); the device body (12;12a) and heatsink (28;28a) being retained in thermal association with one another such that a first end of the at least one of the optically passive region(s) (20,22;22a) adjacent an end of the active region (14;14a) is provided within an area of the heatsink (28;28a), and a second end of the said at least one optically passive region(s) (20,22;22a) is provided outwith the area of the heatsink (28;28a).

34 Claims, 1 Drawing Sheet

OTHER PUBLICATIONS

Hamilton et al., "Bandgap tuning of visible laser material", Mar. 5, 1998, Electronics Letters, vol. 34, No. 7, pp. 665–666, Apr. 2, 1998.

Kawalski et al., "Fabrication of narrow far–field InGaAs–InAlGaAs broad–area lasers using quantum well intermixed extended cavities", CLEO, Monday Morning, May 4, 1998, pp. 37–38.

Carpenter et al., "SIMS analysis of InGaAs/InAlGaAs wafers—Report No. SI/GLU/6725", Institute of Surface Science and Technology, Loughborough University, Apr. 27, 1998, 26 pgs.

Marsh et al., "Monolithic integration in III–V semiconductors via a universal damage enhanced quantum well intermixing technique", Part of the SPIE Conference on Materials Modification by Ion Irradiation, Quebec, Canada, Jul. 1998, SPIE vol. 3413, 9 pgs.

Saher, Helmy A., "Micro Raman studies of disordering due to dielectric cap annealing in GaAs/AlGaAs heterostructures; A Progress Report", May 5, 1998, 23 pgs.

McDougall et al., "Monolithic Integration via a Universal Damage Enhanced Quantum–Well Intermixing Technique", IEEE Journal of Selected Topics in Quantum Electronics, vol. 4, Jul./Aug. 1998.

Helmy et al., "Quantitative Model for the Kinetics of Compositional Intermixing in GaAs–AlGaAs QuantumConfined Heterostructures", IEEE Journal of Selected Topics in Quantum Electronics, vol. 4, No. 4, pp. 653–660, Jul./Aug. 1998.

Ke et al., "The electronic structure and optical properties of intermixed GaAs/AlGaAs double quantum wells", Journal of Applied Physics, vol. 84, No. 5, pp. 2855–2857, Sep. 1, 1998.

Li et al., "Silica capping for Al 0.3Ga 0.7 As/GaAs and In0.2Ga0.8As/GaAs quantum well intermixing", Applied Physics Letters, vol. 73, No. 23, pp. 3393–3395, Dec. 7, 1998.

Helmy et al., "Control of silica cap properties by oxygen plasma treatment for single–cap selective impurity free vacancy disordering", Applied Physics Letters, vol. 74, No. 5, pp. 732–734, Feb. 1, 1999.

McDougall et al., "GaAs/AlGaAs waveguide pin photodiodes with non–absorbing input facets fabricated by quantum well intermixing", Electronics Letters, vol. 36, No. 8, pp. 749–750, Apr. 13, 2000.

Liu et al., "Fabrication of Monolithically Integrated Mach–Zender Asymmetric Interferometer Switch", IEEE 2000, pp. 412–414.

"A13764 Al–quat MQW structure: Intermixing PL shifts recorded for control sample sputterred on week 1 and annealed each week", 4 pgs.

"Intermixing Process control meeting: Effect of change of control TC from edge to centre", 1 pg., Apr. 6, 2000.

Qui et al., "Monolithically Integrated Fabrication of 2×2 and 4×4 Crosspoint Switches Using Quantum Well Intermixing", pp. 415–418, IEEE 2000.

Ke et al., "Monolithically integrated distributed Bragg reflector lasers for 1.5 um operation with band gap shifted grating section", Optical Materials 14 (2000), pp. 193–196.

McDougall et al., "Harmonic modelocking at up to 440GHz repetition rates in InGaAs–InAlGaAs quantum well lasers", Department of Electronics and Electrical Engineering, University of Glasgow.

Kowalski et al., "Monolithic integration in InGaAs–InAlGaAs optoelectronic devices for 1.55 um emission by quantum well intermixing", Department of Electronics and Electrical Engineering, University of Glasgow.

Marsh et al., "Quantum well intermixing in material systems for 1.5 um (invited)", J. Vac. Sci., Technol. A 16(2), pp. 810–816, Mar./Apr. 1998.

Camacho et al., "Laser structure for generating high optical power in a singlemode waveguide", Electronics Letters, vol. 34, No. 5, pp. 460–461, Mar. 5, 1998.

* cited by examiner

OPTICAL DEVICES

FIELD OF INVENTION

The present invention relates to optical devices and in particular, though not exclusively, to packaging or mounting of semiconductor optically active or optoelectronic devices such as lasers, modulators, amplifiers, switching structures, or the like.

BACKGROUND TO INVENTION

In semiconductor devices which include an active region current passing through the active region causes heating through non-radiative re-combination. To dissipate the heat the devices are typically attached/bonded to a heatsink. Typically the devices are operated junction side down to improve cooling by placing the active region close to the heatsink. For ease of coupling to the device, ends (facets) of the device overhang the heatsink. This arrangement has the disadvantage that heat builds up at the facets due to the lack of conductive pathways causing increased absorption at the facets resulting in a reduction of performance and potentially Catastrophic Optical Mirror Damage (COMD). Conversely, if the heatsink is made longer than the device the edge of the heatsink may cut-off some of the emitted light, and if as typically happens solder used to bond the device to the heatsink "balls" up at an output end of the device this also obstructs the emitted light.

A prior art arrangement used to seek to overcome these disadvantages uses a device in which the active region is arranged at an acute angle to sides of a heatsink. The device is then located on the heatsink which is effectively equal in length to the active length of the device. This arrangement reduces heat dissipation at the facets. Unfortunately, this arrangement requires high manufacturing tolerances, limits coupling to other optical components, eg optical fibres, and cannot be used for devices with two or more active regions arranged in parallel.

It is an object of at least one embodiment of at least one aspect of the present invention to provide a semiconductor optically active device which obviates or mitigates one or more of the aforementioned disadvantages.

SUMMARY OF INVENTION

According to a first aspect of the present invention there is provided an optically active device comprising:
 a device body having an active region and an optically passive region(s) provided at one or more ends of the active region; and
 a heatsink;
 the device body and heatsink being retained in thermal association with one another such that a first end of the at least one of the optically passive region(s) adjacent an end of the active region is provided within an area of the heatsink, and a second end of the said at least one optically passive region(s) is provided outwith the area of the heatsink.

The active region may comprise an optically and optionally electically active region.

In a most preferred form, the optically active device is a semiconductor device, preferably fabricated in a III-V semiconductor materials system such as Gallium Arsenide (GaAs), eg working substantially in a wavelength range 600 to 1300 nm or Indium Phosphide (InP), eg working substantially in a wavelength range 1200 to 1700 nm. For example, the material may be AlGaAs or InGaAsP.

The device body may be selected from a laser device, eg laser diode, or optical modulator, an optical amplifier, an optical switch, or the like.

Preferably the/one of the optically passive region(s) is at an output(s) of the optically active device/device body.

An optically active device comprising a semiconductor laser device according to the present invention may have one optically passive region extending beyond an end/edge/side of the heatsink, while an optical amplifier according to the present invention may have two optically passive regions each extending beyond opposite ends/edges/sides of the heatsink.

Preferably, the semiconductor device may be of a monolithic construction. Preferably also the semiconductor device may be grown or otherwise formed on a substrate. More preferably the semiconductor device comprises an active core layer sandwiched between (or lower) optical cladding/charge carrier confining layer and a second (or upper) optical cladding/charge carrier confining layer. It will be appreciated that "upper" and "lower" are used herein for ease of reference, and not to imply any particular preferred disposition of the layers. Indeed, in use, the device may be caused to adopt an inverted disposition.

The semiconductor device may include a ridge (or rib) formed in at least the second cladding layer which ridge may act, in use, as an optical waveguide so as to laterally confine an optical mode in the semiconductor device.

Preferably the active core layer may comprise a lasing material which may comprise or include a Quantum Well (QW) structure being configured as the optically active region, the optically active region being confined by the ridge.

The/each at least one optically passive region may be as laterally extensive as the optically active region.

Preferably the optically passive region(s) may include a first compositionally disordered material within the core layer.

In a modification, the optically active region may be laterally bounded by lateral regions comprising a second compositionally disordered material within the core layer.

Advantageously the first and second compositionally lasing materials are substantially the same. Preferably the compositionally disordered materials may be formed by a Quantum Well Intermixing (QWI) technique. The QWI technique may wash out the quantum well confinement of the quantum wells within the active core layer.

More preferably, the QWI may be substantially impurity free. The QWI regions may be "blue-shifted", that is, typically at least 20-30 meV, and likely around 100 meV or more difference exists between the band-gaps of the optically active region pumped with current, and the QWI optically passive region(s). The optically passive region(s) may have a higher band-gap energy and therefore a lower absorption than the optically active region.

Thus when the optically active region is electrically driven the optically passive region(s) limit heat dissipation at end(s) of the device body. The reduced heat dissipation allows the ends to be positioned over the ends of the heatsink, ie to overhang the heatsink. This leaves an input or output optical beam of the device free from obstruction, and gives clear access to the input/output beam at the ends of the structure to couple to or from other optical devices, eg fibre optic cable.

Typically the passive regions may be around 10 to 100 $\mu$m in length.

Preferably the device also comprises respective layers of electrical contact material contacting at least a portion of an upper surface of the second layer and second cladding layer and a (lower) surface of the first cladding layer, or more probably, a lower surface of the substrate. One of the contact material may be provided on an upper surface of the ridge.

Preferably the heatsink is made from a high thermal conductivity material, eg at least partly of Copper, Diamond, Silicon, Aluminium Nitride or the like.

Preferably also the heatsink is located against one of the contact material with a solder contact or thermal equivalent.

Preferably the second cladding layer is orientated to be closer to the heatsink than the first cladding layer. This configuration is termed as "junction side-down", and by having the active region as close to the heatsink as possible provides an improved efficient cooling configuration.

According to a second aspect of the present invention, there is provided a method of forming an optically active device comprising the steps of:

(a) fabricating a device body having an active region and an optically passive region(s) provided at one or more ends of the active region; and (b) positioning a heatsink and the device body in thermal association such that a first end of at least one of the optically passive regions adjacent an end of the active region is provided within an area of the heatsink and a second end of said at least one optically passive region is provided outwith the area of the heatsink.

Preferably step (a) comprises:

(i) forming in order:
a first optical cladding/charge carrier confining layer;
an active layer which may comprise an optically and/or electrically active layer in which is optionally formed a Quantum Well (QW) structure; and
a second optical cladding/charge carrier confining layer;

(ii) forming the optically passive region(s) in the active layer;

(iii) forming a ridge from at least a portion of the second cladding layer to confine the active region and at least one of the optically passive region(s);

Step (i) may be performed by known growth techniques such as Molecular Beam Epitaxy (MBE) or Metal Organic Chemical Vapour Deposition (MOCVD).

Preferably in step (ii) the passive region(s) may be formed by a Quantum Well Intermixing (QWI) technique which may preferably comprise generating vacancies in the passive regions, or alternatively implanting or diffusing ions into the passive region(s), and further annealing to create a compositionally disordered region(s) of the optically active layer (which may comprise a lasing material), having a larger band-gap than the Quantum Well structure. The passive region(s) may therefore be formed by Quantum Well Intermixing (QWI).

Preferably step (iii) may be achieved by known etching techniques, eg dry or wet etching.

Preferably the heatsink may be secured to a surface adjacent the second cladding layer. In this embodiment the heatsink may therefore be attached to an upper surface of the ridge in a "junction side-down" configuration. Preferably the first cladding layer may be formed on a substrate. In a modification the heatsink may be attached to a surface of the substrate.

Preferably, step (ii) may be performed by generating impurity free vacancies and more preferably may use a damage induced technique to achieve Quantum Well Intermixing. In a preferred implementation of such a technique, the method may include the steps of:

depositing by use of a diode sputterer and within a substantially Argon atmosphere a dielectric layer such as Silica ($SiO_2$) on at least part of a surface of the semiconductor laser device material so as to introduce point structural defects at least into a portion of the material adjacent the dielectric layer;

optionally depositing by a non-sputtering technique such as Plasma Enhanced Chemical Vapour Deposition (PECVD) a further dielectric layer on at least another part of the surface of the material;

annealing the material thereby transferring Gallium from the material into the dielectric layer. Such a technique is described in co-pending application entitled "Method of Manufacturing Optical Devices and Related Improvements" also by the present Applicant, and having the same filing date as the present application, the content of which is incorporated herein by reference.

Preferably, the method may include the step of applying first and second electrical contact layers on a surface of the first cladding layer, or more preferably an outer surface of the substrate, and an outer surface of the ridge. More preferably, the second electrical contact layer may be provided on a portion of the ridge within an area of the optically active region.

In a further embodiment of the present invention step (ii) may comprise the steps of, first selecting a first area and forming a first compositionally disordered material thereat, and second selecting a second area and forming a second compositionally disordered material thereat. The first and second compositionally disordered material may respectively provide first and second passive regions at first and second ends of the device body.

In a modification, the method may include, preferably in step (ii), forming regions of compositionally disordered material laterally bounding the active region. These may assist the ridge in confining the optical mode(s) of the device.

BRIEF DESCRIPTION OF DRAWINGS

Embodiments of the present invention will now be described by way of example only, with reference to the accompanying drawings, which are.

DETAILED DESCRIPTION OF DRAWINGS

Figure 1:
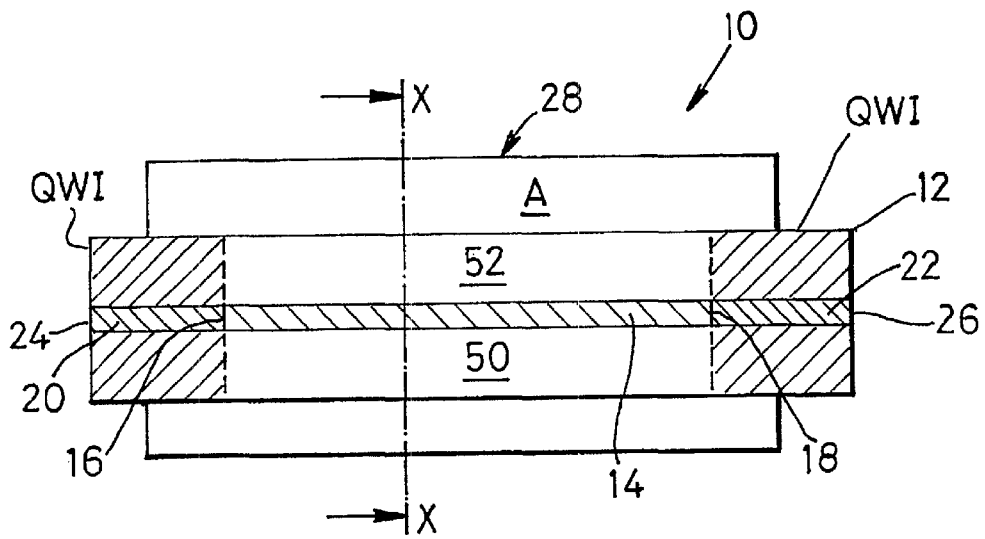
FIG. 1 align a cross-sectional view of an optically active device according to a first embodiment of the present invention.
Figure 2:
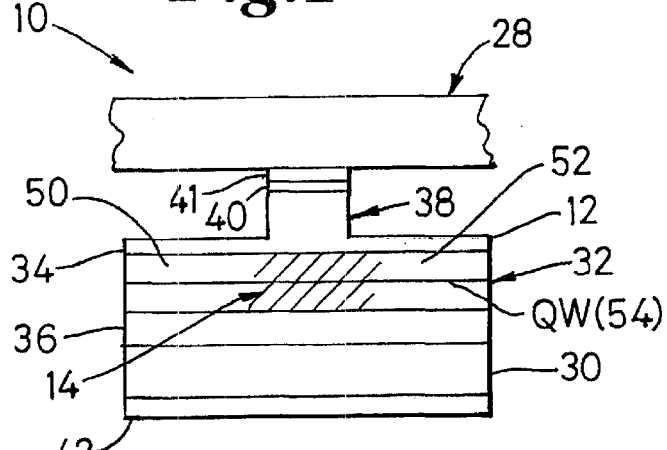
FIG. 2 a cross-sectional view through line X-X' of the optically active device of FIG. 1.

Referring to FIGS. 1 and 2 there is illustrated an optically active device, generally designated 10, according to a first embodiment of the present invention. The device 10 comprises a device body 12, which in this embodiment is fabricated from a semiconductor material defining an optically active or optical gain region 14 which is bounded at first and second ends 16, 18 thereof by optically passive regions 20, 22 respectively. Outer ends 24, 26 of the passive regions 20, 22 define ends or facets 23, 24 of the device 10.

A heatsink 28 is in thermal association with the device body 12 and arranged such that inner ends 16, 18 of the passive regions 20, 22 at ends 16, 18 of the gain region 14 are provided within an area or extent "A" of the heatsink 28, while the second ends 24, 26 are provided outwith (outside) the area 28, as viewed in the orientation of FIG. 1.

This arrangement provides passive regions 20, 22 which "overhang" the heatsink 28. Such an arrangement may be used for an optically active device 10 such as an optical amplifier, where access is required at both an input and output end of the. Thus the passive regions 20, 22 may be considered as input/output waveguides of the device 10, which extend beyond opposite ends 24, 26 of an optically active region of the device 10.

Referring now to FIG. 2, which shows the device 10 of FIG. 1 in cross-section along line X-X; as can be seen, the device 10a is monolithic, being grown on a substrate 30. The device body 12 is a layered structure comprising substrate 30, upon which is grown by known techniques such as Molecular Beam Epitaxy (MBE)or Molecular Organic Chemical Vapour Deposition (MOCVD), a first optical cladding/charge carrier confining layer 36, and active/guiding layer 32, eg of semiconductor lasing material, and a second cladding/charge carrier confining layer 34, and also beneficially semiconductor contact layer 40.

The device body 12 includes a waveguide 38 formed in the second cladding layer 34 by suitable etching techniques. The ridge 38 confines an optical beam within the optically active region 14 and the optically passive regions 20, 22 (not shown). The ridge 38 extends between the ends 24, 26 of the device 10, 10a.

On an outer facing surface of the ridge 38 and below the substrate 30 are located respective electrical contact layers 41, 42 used to electrically drive the device 10.

In a preferred form of this embodiment, the active layer 32 comprises a Quantum Well structure 54 embedded in the active layer 32 and, by confinement of the ridge 38, the gain region 14 is located in the active layer 32.

In a modification of this embodiment the gain region 14 is laterally bounded by Quantum Well Intermixed (QWI) regions 50, 52 which aid confinement of an optical beam within the Quantum Well structure of the gain region 14.

Returning again to FIG. 1, the passive regions 24, 26 within the active layer 32 comprise Quantum Well Intermixed regions providing a higher band-gap energy and therefore lower absorption than the Quantum Well structure of the gain region 14 within the active layer 32. This has an advantage that when the active region 14 is pumped with current heat dissipation at ends 16,18 of the active region 14 are provided with thermal contact to an area of heatsink 28 giving cooling of the device 10, while the passive regions 20, 22 overhang the heatsink 28 dissipating less heat. The ends 24, 26 of the passive regions 20, 22 are free from any obstruction of the heatsink 28, thus giving clear access to the ends 24, 26 of the device 10 for input/output coupling, eg to other optical devices. As shown in FIG. 2, the device 10 is arranged in a "junction side-down" configuration so that the gain region 14 is as close to the heatsink 28 as possible. It will be appreciated that, in use, the heatsink 28 may be lowermost, and the (inverted) device body 12 uppermost.

In the device 10 the distance between the heatsink 28 and the gain region 14 is likely to be typically around 2 to 5 $\mu$m.

The heatsink 28 is chosen to be of a material having good thermal characteristics. In this embodiment the heatsink 28 is made substantially of Copper. However, other material such as Diamond, Silicon and Aluminium Nitride are appropriate also. The heatsink 28 is soldered or otherwise adhered to the contact 41.

The QW Intermixed regions are the passive regions 20, 22, in the active layer 32 shown in FIGS. 1 and 2. The ridge 38 is formed over the gain region 14, and the passive regions 20, 22.

Referring again to FIG. 2, a method will now be described for fabrication of an optically active device 10 according to an embodiment of the present invention made in a III-V semiconductor materials system such as GaAs or InP.

The method begins with providing substrate layer 30. The substrate is, in this embodiment Gallium Arsenide (GaAs) and is highly n-type doped. Grown on the substrate layer 30 is the first cladding layer 36. The first cladding layer 36 comprises Aluminium Gallium Arsenide (AlGaAs) and is n-type doped to a first concentration. This first cladding layer 36, eg having a refractive of around 3.0 to 3.5, is typically 1 to 3 $\mu$m thick. Grown on the first cladding layer 36 is the semiconductor optically active layer 32. The active layer 32 also comprises AlGaAs. Layer 32 is substantially intrinsic. The active layer 32, eg having a refractive index of around 3.0 to 3.5, is grown to be a few hundred nm thick, typically. Within the active layer 32, is provided a Quantum Well (QW) structure 54. The QW structure 54 is typically embedded in the middle of the layer 32.

On the active layer 32 is grown the second cladding layer 34. The second cladding layer 34 is of p-type with a similar doping concentration to the first concentration. The second layer 34 is also made of AlGaAs with a thickness, composition, and refractive index similar to that of the first cladding layer 36. Thus the Quantum Well (QW) structure 54 is sandwiched between n-type and p-type first and second cladding layers 36 and 34, respectively. Active layer 32 has a lower Aluminium (Al) content than cladding layers 34,36. The active layer 32 has a higher refractive index than the cladding layers 36,34.

A selective QWI mask (not shown) is then placed at least over a portion of the device 10 where the ridge 38 will be defined, but leaving portions (coincident with the passive regions 20,22 to be formed) unmasked. The technique preferably used to create Quantum Well Intermixing (QWI) within the Quantum Well structure is a damage induced technique using vacancies. However, it will be understood that any other Quantum Well Intermixing technique which achieves a difference in the band-gap energy between the Quantum Well structure 54 and the QW intermixed passive regions 20, 22 could be used within this invention. The damage induced technique requires depositing by use of a diode sputterer and within a substantially Argon atmosphere a dielectric layer such as Silica ($SiO_2$) on at least part of a surface of the semiconductor laser device material so as to introduce point structural defects at least into a portion of the material adjacent the dielectric layer;

optionally depositing by a non-sputtering technique such as Plasma Enhanced Chemical Vapour Deposition (PECVD) a further dielectric layer on at least another part of the surface of the material;

annealing the material thereby transferring Gallium from the material into the dielectric layer.

Once the device body 12 has been annealed, portions of the second cladding layer 34 on either side of the ridge 38 is to be defined are etched away by known etching techniques once a suitable etch mask has been placed over an area defining the ridge 38.

As can be seen from FIG. 2, at the time of growth of the device body 12, a final layer 40 may be grown on the second cladding layer 34, the final layer 40 being a highly doped p-type GaAs layer 40. The final layer 40 acts as the upper contact for the device body 12.

Contact metallisation 41, 42 are formed by known lithographic techniques on rib 38, and on substrate 30 respectfully, so as to allow for electrical driving of the device body 12. Finally the device body 12 is secured to the heatsink 28.

Thus the device body 12 shown in the cross-section of FIG. 2 is a monolithic semiconductor active device. The active region 14 of the device 10 is within the active layer 32 and confined in the Quantum Well structure by the ridge 38 above.

Figure 3:
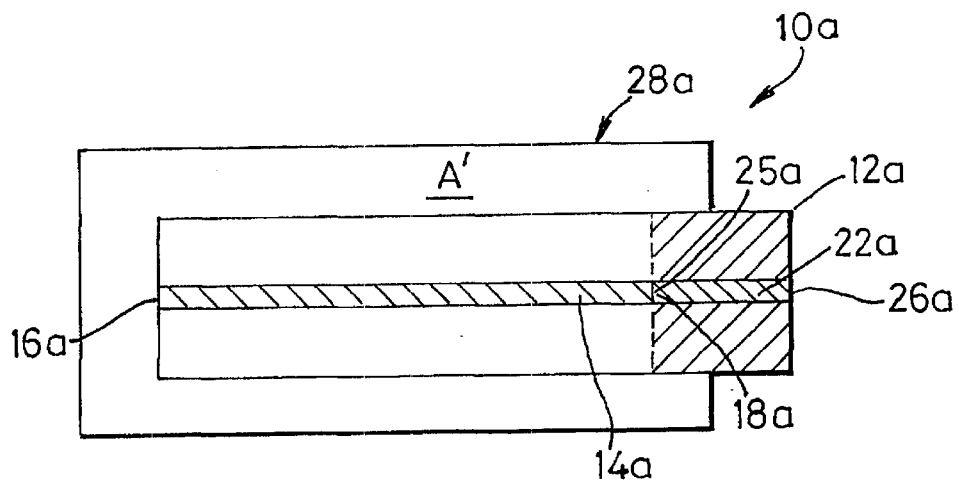
FIG. 3 a cross-sectional view of an optically active device according to a second embodiment of the present invention.

Referring now to FIG. 3, there is shown an optically active device, generally designated 10a, according to a second embodiment of the present invention. The device 10a has similarities to the semiconductor device 10 of the first embodiment, and accordingly like parts have been given the same nomenclature but are suffixed "a".

The device 10a comprises a device body 12 having an active region 14a which is bounded on one end 18a by an optically passive region 22a, having a first end 25a. Another end 16a of the gain region 14a and second end 26a of the passive region 22a define ends of the device 10a. A heatsink 28a is in thermal association with the device body 12 and arranged such that the ends 16a,18a of the gain region 14a are provided within an area A of the heatsink 28a while the second end 26a of the passive region 22a is outwith (outside) the area A of the heatsink 28a.

This embodiment provides one passive region 22a which "overhangs" the heatsink 28a. Such an arrangement may be used for an optically active device such as a semiconductor laser diode where an output of the device 10a is provided it is at end 26a.

The layered construction of the device 10a is as described hereinbefore for the first embodiment with reference to FIGS. 1 and 2. The passive region 26 is a Quantum Well Intermixed (QWI) region providing a higher band-gap energy, and therefore lower absorption than the QW structure of the gain region 14a.

This arrangement has the advantage that the ends 16a,18a of the gain region 14a are provided in good thermal contact with the heatsink 28a while clear access is given to the output end 26a of the device 10a, eg for output coupling to a fibre or other device.

The device 10a may be fabricated by a method similar to, or the same as, the method hereinbefore described for the device 10.

It will be appreciated by those skilled in the art that modifications may be made to the embodiments hereinbefore described without departing from the scope of the invention.

It will also be appreciated that a principal advantage of the present invention is that, by the provision of passive regions at end(s) of an optical device overhanging a heatsink, problems associated with heating at facets of the device are improved as the regions are not active. A further advantage of the present invention is that coupling to the device is made easier by the protruding passive regions/waveguides which ensure the output/input beams are not impeded or influenced by the heatsink.

It will also be appreciated that in a modification a buried heterostructure waveguide could be used rather than a ridge waveguide. Further, other waveguides such as Large Optical Cavity (LOC), Antiresonant Reflecting Optical Waveguide (ARROW), Wide Optical Waveguide (WOW), or the like could be used.

What is claimed is:

1. An optically active device comprising:
a device body having an active region and an optically passive region(s) provided at one or more ends of the active region; and
a heatsink;
the device body and heatsink being retained in thermal association with one another such that a first end of at least one of the optically passive region(s) adjacent an end of the active region is provided within an area of the heatsink, and a second end of the said at least one optically passive region(s) is provided outwith the area of the heatsink.

2. An optically active device as claimed in claim 1, wherein the active region comprises an optically and electically active region.

3. An optically active device as claimed in claim 1, wherein the optically active device is a semiconductor device, fabricated in a III-V semiconductor materials system.

4. An optically active device as claimed in claim 3, wherein the III-V semiconductor materials system is selected from a Gallium Arsenide (GaAs) based system, operating substantially in a wavelength range 600 to 1300 nm and an Indium Phosphide (InP) based system, operating substantially in a wavelength range 1200 to 1700 nm.

5. An optically active device as claimed in claim 1, wherein the device body is selected from one of: a laser device, or an optical modulator, an optical amplifier, an optical switch.

6. An optically active device as claimed in claim 1, wherein the/one of the optically passive region (s) is at an output(s) of the device body.

7. An optically active device as claimed in claim 1, wherein the optically active device is a semiconductor laser device, one optically passive region extends beyond an edge of the heatsink.

8. An optically active device as claimed in claim 1, wherein the optically active device is an optical amplifier, and two optically passive regions are provided, each extending beyond opposite edge of the heatsink.

9. An optically active device as claimed in claim 3, wherein the semiconductor device is of a monolithic construction grown on a substrate.

10. An optically active device as claimed in claim 9, wherein the semiconductor device comprises an active core layer sandwiched between a first optical cladding layer and a second optical cladding layer.

11. An optically active device as claimed in claim 10, wherein the semiconductor device includes a ridge formed in at least the second cladding layer which ridge acts, in use, as an optical waveguide so as to laterally confine an optical mode in the semiconductor device.

12. An optically active device as claimed in claim 11, wherein the active core layer comprises a lasing material which comprises or includes a Quantum Well (QW) structure being configured as the optically active region, the optically active region being confined by the ridge.

13. An optically active device as claimed in claim 1, wherein the/each at least one optically passive region is as laterally extensive as the optically active region.

14. An optically active device as claimed in claim 10, wherein the optically passive region(s) includes a first compositionally disordered material within the core layer.

15. An optically active device as claimed in claim 14, wherein the optically active region is laterally bounded by lateral regions comprising a second compositionally disordered material within the core layer.

16. An optically active device as claimed in claim 15, wherein the first and second compositionally lasing materials are substantially the same.

17. An optically active device as claimed in claim 14, wherein the first compositionally disordered material is formed by a Quantum Well Intermixing (QWI) technique.

18. An optically active device as claimed in claim 1, wherein the passive region(s) is/are around 10 to 100 µm in length.

19. An optically active device as claimed in claim 11, wherein the device also comprises respective layers of electrical contact material contacting at least a portion of an upper surface of the second cladding layer and an opposing surface of the substrate.

20. An optically active device as claimed in claim 19, wherein one of the contact materials is provided on a surface of the ridge.

21. An optically active device as claimed in claim 1, wherein the heatsink is made from a high thermal conductivity material.

22. An optically active device as claimed in claim 21, wherein the high conductivity material at least partly comprises of Copper, Diamond, Silicon, or Aluminium Nitride.

23. An optically active device as claimed in claim 19, wherein the heatsink is located against one of the contact materials with a solder contact.

24. An optically active device as claimed in claim 10, wherein the second cladding layer is orientated to be closer to the heatsink than the first cladding layer.

25. A method of forming an optically active device comprising the steps of:
 (a) fabricating a device body having an active region and an optically passive region(s) provided at one or more ends of the active region; and
 b) positioning a heatsink and the device body in thermal association such that a first end of at least one of the optically passive regions adjacent an end of the active region is provided within an area of the heatsink and a second end of said at least one optically passive region is provided outwith the area of the heatsink.

26. A method of forming an optically active device as claimed in claim 25, wherein step (a) comprises:
 (i) forming in order:
  a first optical cladding/charge carrier confining layer;
  an active layer which may comprise an optically and/or electrically active layer in which is optionally formed a Quantum Well (QW) structure; and
  a second optical cladding/charge carrier confining layer;
 (ii) forming the optically passive region(s) in the active layer.
 (iii) forming a ridge from at least a portion of the second cladding layer to confine the active region and at least one of the optically passive region(s);

27. A method of forming an optically active device as claimed in claim 26, wherein step (i) is performed by a growth technique selected from Molecular Beam Epitaxy (MBE) and Metal Organic Chemical Vapour Deposition (MOCVD).

28. A method of forming an optically active device as claimed in claim 26, wherein in step (ii) the passive region (s) are formed by a Quantum Well Intermixing (QWI) technique which comprises generating vacancies in the passive regions and further annealing to create a compositionally disordered region(s) of the optically active layer having a larger band-gap than the Quantum Well structure, as grown.

29. A method of forming an optically active device as claimed in claim 26, wherein step (iii) is achieved by etching.

30. A method of forming an optically active device as claimed in claim 26, wherein the heatsink is secured to a surface adjacent the second cladding layer.

31. A method of forming an optically active device as claimed in claim 26, wherein step (ii) of the method includes the steps of:
 depositing by use of a diode sputterer and within a substantially Argon atmosphere a dielectric layer such as Silica ($SiO_2$) on at least part of a surface of the semiconductor laser device material so as to introduce point structural defects at least into a portion of the material adjacent the dielectric layer;
 optionally depositing by a non-sputtering technique such as Plasma Enhanced Chemical Vapour Deposition (PECVD) a further dielectric layer on at least another part of the surface of the material;
 annealing the material thereby transferring ions or atoms from the material into the dielectric layer.

32. A method of forming an optically active device as claimed in claim 26, wherein the method includes the step of applying first and second electrical contact layers on a surface of the substrate, and opposing surface of the ridge.

33. A method of forming an optically active device as claimed in claim 26, wherein step (ii) comprises the steps of, first selecting a first area and forming a first compositionally disordered material thereat, and second selecting a second area and forming a second compositionally disordered material thereat, the first and second compositionally disordered material respectively providing first and second passive regions at first and second ends of the device body.

34. A method of forming an optically active device as claimed in claim 32, wherein the method includes forming regions of compositionally disordered material laterally bounding the active region.

* * * * *

UNITED STATES PATENT AND TRADEMARK OFFICE
CERTIFICATE OF CORRECTION

PATENT NO.      : 6,671,300 B2
DATED           : December 30, 2003
INVENTOR(S)     : John Haig Marsh and Craig James Hamilton It is certified that error appears in the above-identified patent and that said Letters Patent is hereby corrected as shown below:

Column 7, line 61 through Column 8, line 5,
Cancel the text beginning with "1. An optically active device" and ending with "of the heatsink", and insert the following claim:

1. An optically active device comprising:
        a device body having an active region and a first optically passive region extending from one end of the active region, the first optically passive region having an inner end adjacent the active region and an outer end that defines a first facet of the device; and
        a heat sink retained in thermal association with the device body, the heat sink being coextensive with at least part of the active region and coextensive with only a part of the optically passive region such that the first facet of the device overhangs the heat sink.

Column 8,
Lines 6-8, cancel the text beginning with "2. An optically active device" and ending with "electically active region" and insert the following claim:
    2. An optically active device as claimed in Claim 1, wherein the active region comprises an optically and electrically active region.

Lines 18-21, cancel the text beginning with "5. An optically active device" and ending with "switch" and insert the following claim:
    5. An optically active device as claimed in Claim 1, wherein the device body is selected from one of : a laser device, an optical modulator, an optical amplifier, and an optical switch.

Lines 22-32, cancel the text beginning with "6. An optically active device" and ending with "heatsink" and insert the following claims:

6. An optically active device as claimed in Claim 1, wherein the first optically passive region is at an output of the device body.

7. An optically active device as claimed in Claim 1, wherein the optically active device is a semiconductor laser device, one optically passive region extending beyond an edge of the heatsink.

8. The optically active device of Claim 1, wherein said end of the active region is a first end, the device including a second optically passive region extending from a second end of the active region opposite the first end, the second optically passive region having an inner end adjacent the second end of the active region and an outer end that defines a second facet of the device;
    the heat sink being coextensive with only a part of the second optically passive region such that the second facet of the device overhangs the heat sink.

UNITED STATES PATENT AND TRADEMARK OFFICE
CERTIFICATE OF CORRECTION

PATENT NO. : 6,671,300 B2
DATED : December 30, 2003
INVENTOR(S) : John Haig Marsh and Craig James Hamilton It is certified that error appears in the above-identified patent and that said Letters Patent is hereby corrected as shown below:

Column 8 (cont'd),
Lines 39-48, cancel the text beginning with "11. An optically" and ending with "ridge" and insert the following claims:

11. An optically active device as claimed in Claim 10, wherein the optically passive region is disposed laterally of the active region, the semiconductor device including a waveguide formed in at least the second cladding layer adjacent the active region, the waveguide taking the form of a ridge extending upwardly from the active region.

12. An optically active device as claimed in Claim 11, wherein the active core layer comprises a lasing material which comprises a Quantum Well (QW) structure being configured as the active region.

Lines 49-51, cancel the text beginning with "13. An optically active device" and ending with ""optically active region." and insert the following claim:
    13. An optically active device as claimed in Claim 1, wherein said first optically passive region is as laterally extensive as the active region.

Lines 59-61, cancel the text beginning with "16. An optically active device" and ending with "substantially the same" and insert the following claim:
    16. An optically active device as claimed in Claim 15, wherein the first and second compositionally disordered materials are substantially the same.

Lines 65-67, cancel the text beginning with "18. An optically active device" and ending with "in length" and insert the following claim:
    18. An optically active device as device as claimed in Claim 1, wherein the passive region is around 10 to 100 $\mu$m in length.

Column 9,
Lines 8-10, cancel the text beginning with "21. An optically active device" and ending with "material." and insert the following claim:
    21. An optically active device as claimed in Claim 1, wherein the heat sink is made from a high thermal conductivity material.

UNITED STATES PATENT AND TRADEMARK OFFICE
CERTIFICATE OF CORRECTION

PATENT NO.    : 6,671,300 B2
DATED         : December 30, 2003
INVENTOR(S)   : John Haig Marsh and Craig James Hamilton It is certified that error appears in the above-identified patent and that said Letters Patent is hereby corrected as shown below:

Column 9 (cont'd),
Lines 14-44, cancel the text beginning with "23. An optically" and ending with "regions (s);" and insert the following claims:

23. An optically active device as claimed in Claim 19, wherein the heat sink is located against one of the contact materials with a solder contact.

24. An optically active device as claimed in Claim 10, wherein the second cladding layer is oriented to be closer to the heat sink than the first cladding layer.

25. A method of forming an optically active device comprising the steps of:
    (a) fabricating a device body having an active region and at least one optically passive region provided at a respective end of the active region; and
    (b) positioning a heat sink and the device body in thermal association such that a first end of said at least the optically passive region adjacent an end of the active region is provided within an area of the heat sink and a second end of said at least one optically passive region is provided outwith the area of the heatsink.

26. A method of forming an optically active device as claimed in Claim 25, wherein step (a) comprises:
    (i) forming in order:
    a first optical cladding/charge carrier confining layer;
    an active layer selected from the group consisting of an optically active layer, an electrically active layer and an optically and electrically active layers; and
    a second optical cladding/charge carrier confining layer;
    (ii) forming the optically passive region in the active layer; and
    forming a ridge from at least a portion of the second cladding layer to confine the active region and at least one of the optically passive region(s).

Column 10,
Lines 1-8, cancel the text beginning with "28. A method" and ending with "as grown" and insert the following claim:

28. A method of forming an optically active device as claimed in Claim 26, wherein step (i) forms a quantum well structure, and in step (ii) the passive region is formed by a Quantum Well Intermixing (QWI) technique which comprises generating vacancies in the passive regions and further annealing to create a compositionally disordered region of the optically active layer having a larger band-gap than the quantum well structure.

UNITED STATES PATENT AND TRADEMARK OFFICE
CERTIFICATE OF CORRECTION

PATENT NO. : 6,671,300 B2
DATED : December 30, 2003
INVENTOR(S) : John Haig Marsh and Craig James Hamilton It is certified that error appears in the above-identified patent and that said Letters Patent is hereby corrected as shown below:

Column 10 (cont'd),
Line 13-35, cancel the text beginning with "30. A method" and ending with "ridge." and insert the following claims:

30. A method of forming an optically active device as claimed in Claim 26, wherein the heat sink is secured to a surface adjacent the second cladding layer.

31. A method of forming an optically active device as claimed in Claim 26, wherein step (ii) of the method includes the steps of:
depositing by use of a diode sputterer and within a substantially Argon atmosphere a dielectric layer on at least part of a surface of the semiconductor laser device material so as to introduce point structural defects at least into a portion of the material adjacent the dielectric layer; and
annealing the material thereby transferring ions or atoms from the material into the dielectric layer.

32. A method of forming an optically active device as claimed in Claim 26, wherein the method includes the step of applying first and second electrical contact layers on a surface of the substrate, and an opposing surface of the ridge.

Lines 36-43, cancel the text beginning with "33. A method of" and ending with "device body" and insert the following claim:

33. A method of forming an optically active device as claimed in Claim 26, wherein step (ii) comprises the steps of, first selecting a first area and forming a first compositionally disordered material thereat, and second selecting a second area and forming a second compositionally disordered material thereat, the first and second compositionally disordered materials respectively providing first and second passive regions at first and second ends of the device body.

Signed and Sealed this

Tenth Day of May, 2005

JON W. DUDAS
*Director of the United States Patent and Trademark Office*